US011870003B2

(12) United States Patent
He et al.

(10) Patent No.: US 11,870,003 B2
(45) Date of Patent: Jan. 9, 2024

(54) PATTERNED EPITAXIAL STRUCTURE LASER LIFT-OFF DEVICE

(71) Applicant: NANTONG CHINA RAILWAY HUAYU ELECTRIC CO., LTD, Jiangsu (CN)

(72) Inventors: Xiaofeng He, Jiangsu (CN); Chengming Li, Jiangsu (CN); Xiuping He, Jiangsu (CN); Jianfeng Chen, Jiangsu (CN)

( * ) Notice: Subject to any disclaimer, the term of this patent is extended or adjusted under 35 U.S.C. 154(b) by 893 days.

(21) Appl. No.: 16/768,686

(22) PCT Filed: Sep. 21, 2018

(86) PCT No.: PCT/CN2018/106980
§ 371 (c)(1),
(2) Date: May 31, 2020

(87) PCT Pub. No.: WO2019/242139
PCT Pub. Date: Dec. 26, 2019

(65) Prior Publication Data

US 2021/0175388 A1 Jun. 10, 2021

(30) Foreign Application Priority Data

Jun. 19, 2018 (CN) ........................ 201810630282.1

(51) Int. Cl.
*H01L 21/00* (2006.01)
*H01L 33/00* (2010.01)
*B23K 26/53* (2014.01)
*B23K 26/06* (2014.01)
(Continued)

(52) U.S. Cl.
CPC ...... *H01L 33/0093* (2020.05); *B23K 26/0648* (2013.01); *B23K 26/127* (2013.01);
(Continued)

(58) Field of Classification Search
CPC ............ H01L 33/0093; B23K 26/0648; B23K 26/127
See application file for complete search history.

(56) References Cited

U.S. PATENT DOCUMENTS 8,581,263 B2 * 11/2013 Knollenberg ....... H01L 33/0075 438/33
2010/0148188 A1 * 6/2010 Knollenberg ....... H01L 33/0075 438/33
(Continued)

FOREIGN PATENT DOCUMENTS

CN 101879657 A 11/2010
CN 107452898 A * 12/2017 ............ H01L 51/56
(Continued)

OTHER PUBLICATIONS

International search report of PCT/CN2018/106980.

*Primary Examiner* — Laura M Menz

(57) ABSTRACT

A patterned epitaxial structure laser lift-off device, including a substrate, reshaping structures, a transmittance adjustment structure, a patterned epitaxial structure, gas transmission systems, an ultraviolet source, a lift-off chamber and a light entry window. The gas transmission systems are at two sides of the lift-off chamber; the light entry window is on the lift-off chamber; the ultraviolet source is above the outside of the light entry window; the patterned epitaxial structure is inside the lift-off chamber; the substrate is on the patterned epitaxial structure. The patterned epitaxial structure includes an epitaxial structure, a sapphire substrate, patterned structures, oblique interfaces and planar interfaces, several patterned structures being uniformly designed on the epitaxial structure, each of the patterned structures being a V-shaped groove structure formed by two oblique interfaces, two adjacent patterned structures being connected by means of a planar interface.

8 Claims, 2 Drawing Sheets

(51) Int. Cl.

| | |
|---|---|
| ***B23K 26/12*** | (2014.01) |
| ***G02B 27/09*** | (2006.01) |
| ***H01L 33/20*** | (2010.01) |
| ***H01S 5/02*** | (2006.01) |
| *B23K 26/0622* | (2014.01) |

(52) U.S. Cl.

CPC .......... *B23K 26/53* (2015.10); *G02B 27/0955* (2013.01); *H01L 33/007* (2013.01); *H01L 33/20* (2013.01); *H01S 5/0213* (2013.01); *H01S 5/0217* (2013.01); *B23K 26/0622* (2015.10); *H01S 2304/02* (2013.01)

(56) References Cited

U.S. PATENT DOCUMENTS

| | | | | |
|---|---|---|---|---|
| 2012/0064735 | A1* | 3/2012 | Zhang | B23K 26/0648<br>438/795 |
| 2021/0175388 | A1* | 6/2021 | He | H01L 33/0093 |

FOREIGN PATENT DOCUMENTS

| | | | | | |
|---|---|---|---|---|---|
| CN | 107452898 | A | | 12/2017 | |
| CN | 108265329 | A | * | 7/2018 | |
| CN | 108538784 | A | * | 9/2018 | B23K 26/0648 |
| CN | 108538784 | A | | 9/2018 | |
| CN | 208538816 | U | * | 2/2019 | B23K 26/0648 |
| EP | 2428979 | A1 | * | 3/2012 | B23K 26/0648 |
| WO | WO-2007119633 | A1 | * | 10/2007 | H01L 33/20 |
| WO | WO-2010127621 | A1 | * | 11/2010 | B23K 26/0648 |
| WO | WO-2019242139 | A1 | * | 12/2019 | B23K 26/0648 |
| WO | WO-2020098258 | A1 | * | 5/2020 | H01L 21/6835 |

* cited by examiner

PATTERNED EPITAXIAL STRUCTURE LASER LIFT-OFF DEVICE

CROSS REFERENCE TO RELATED APPLICATION

This application is a continuation of International Patent Application No. PCT/CN2018/106980, filed on Sep. 21, 2018, which claims priority benefit of Chinese Patent Application No. 201810630282.1, filed on Jun. 19, 2018 and the entire contents of which are incorporated herein by reference.

TECHNICAL FILED

The present disclosure relates to a laser lift-off device, in particular to a patterned epitaxial structure laser lift-off device.

BACKGROUND

Gallium nitride-based materials and optoelectronic device materials have become more and more widely used in the field of optoelectronic devices in recent years, especially the current MicroLED, which has more important application value in the fields of lighting and display. In the process of all these applications, the quality of material growth has an important impact, on device performance. If the device performance wants to be improved, homoepitaxy is the most important solution, but homogeneous epitaxial thick film substrates are expensive, resulting it is impossible to be applied, comprehensively. In current, the commonly used patterned substrates have become a major approach, and patterned substrates are of great significance for releasing stress during the epitaxial growth of materials. However, in the preparation of materials such as MicroLED by MOCVD or other technologies or in the process of chip device processing, laser lift-off is required. The laser lift-off process has essential requirements about the temperature field distribution and the intensity distribution conditions of the laser lift-off beam for the lift-off conditions, beam quality and the entire lift-off process. Especially for the patterned substrate, during the lift-off process, due to the different material structures and different beam energy requirements of the patterned structure area and the planar structure area, how to perform high-quality laser lift-off is of great significance.

SUMMARY

In order to solve the above-mentioned problems, the present disclosure is to provide a patterned epitaxial structure laser lift-off device, which can realize the lift-off of the patterned substrate and improve the laser lift-off yield.

A patterned epitaxial structure laser lift-off device, including a substrate, reshaping structures, a transmittance adjustment structure, a patterned epitaxial structure, gas transmission systems, an ultraviolet source, a lift-off chamber and a light entry window, wherein the gas transmission systems are respectively provided at two sides of the lift-off chamber; the light entry window is arranged on the lift-off chamber; the ultraviolet source is above the outside of the light entry window; the patterned epitaxial structure is provided inside the lift-off chamber; the substrate is arranged on the patterned epitaxial structure. The patterned epitaxial structure includes an epitaxial structure, a sapphire substrate, patterned structures (the patterned structure is a micro-structure), oblique interfaces and planar interfaces, wherein a plurality of patterned structures are uniformly provided on the epitaxial structure, each of the plurality of the patterned structures is a V-shaped groove structure formed by two oblique interfaces, and two adjacent patterned structures are connected by a planar interface, the sapphire substrate is arranged on the epitaxial structure and the sapphire substrate is, located above the patterned structures, the oblique interfaces and the planar interfaces; the substrate is located on the sapphire substrate, a plurality of reshaping structures are provided on the substrate; the reshaping structures are one-to-one correspondence to the patterned structures, the transmittance adjustment structure is provided between two adjacent reshaping structures and the transmittance adjustment structure is located on the substrate; the light entry window is located above the reshaping structures and the transmittance adjustment structure.

The patterned structure may be composed of a metal organic chemical vapor deposition (MOCVD) LED structure, or a molecular beam epitaxy LD material structure. The substrate includes but is not limited to a sapphire substrate, which is a patterned substrate (PSS). The material of the epitaxial structure can be a single crystal material or a multilayer composite epitaxial material, and its thickness should be at least 1 micron.

The gas transmission system includes an air inlet pipe and an exhaust pipe, and the air inlet pipe is respectively installed at the upper corner positions of both sides of the lift-off chamber, and the exhaust pipe is respectively installed at the middle lower positions of the both sides of the lift-off chamber.

The substrate is a ultraviolet source excited laser wavelength transparent material (so-called transparent, which means no absorption, which is a semiconductor term), including but not limited to wide bandgap materials of sapphire, quartz or calcium fluoride.

The transmittance adjustment structure is installed in contact with edges of the reshaping structures, and a transition light field is formed around the reshaping structures (Certainly, the so-called transmittance adjustment structure is the light transmittance set by the anti-reflective film and the high-reflecting film).

The transmittance adjustment structure is arbitrary structures of high reflection medium film or multilayer film; the transmittance adjustment structure regulates reflectivity according to the needed, including but not limited to sapphire calcium fluoride materials. (Because laser lift-off, partial lift-off, or local lift-off, this requires light adjustment).

The ultraviolet source includes but not limit to an excimer laser, an all solid state laser, a pulse laser or a continuous laser; the ultraviolet source is single wavelength or multi-wavelength; a spot size of the ultraviolet source is between 100 nm and 1 mm. In short, the laser parameters such as type, pulse width and wavelength can be diversified.

The reshaping structure is a convex lens, a concave lens or a Fresnel lens structure, and a dimension of the reshaping structure shall be more than one-fifth of the corresponding light-emitting wavelength.

The patterned structure is the sapphire patterned structure, and a size and a period of the patterned structure shall be more than one third of the light-emitting wavelength or more than 100 nm.

The sapphire substrate is a patterned substrate structure, which may be a single-sided patterned substrate structure on the epitaxial surface, or a patterned structure on both sides. (For the substrate, the patterned structure can be patterned on one side or on both sides).

The top surface of the sapphire substrate is also provided with a back surface patterned structure; according to the need for light modulation or compensation, the shapes of the back surface patterned structure and the patterned structures can be designed the same or different, and the sizes of the the back surface patterned structure and the patterned structures can also be designed the same or different.

A hollow structure is provided in the middle of the transmittance adjustment structure (3), and the shape of the hollow structure is one of a circle, an ellipse, or a triangle.

The present disclosure has advantages in ingenious design and convenient operation, realizing lift-off of a patterned substrate and improving the lift-off yield.

DETAILED DESCRIPTION OF THE EMBODIMENTS

It will be illustrated in detail with reference to the drawings in conjunction with the embodiments, so as to further explain the technical features and advantages of the present disclosure.

Figure 1:
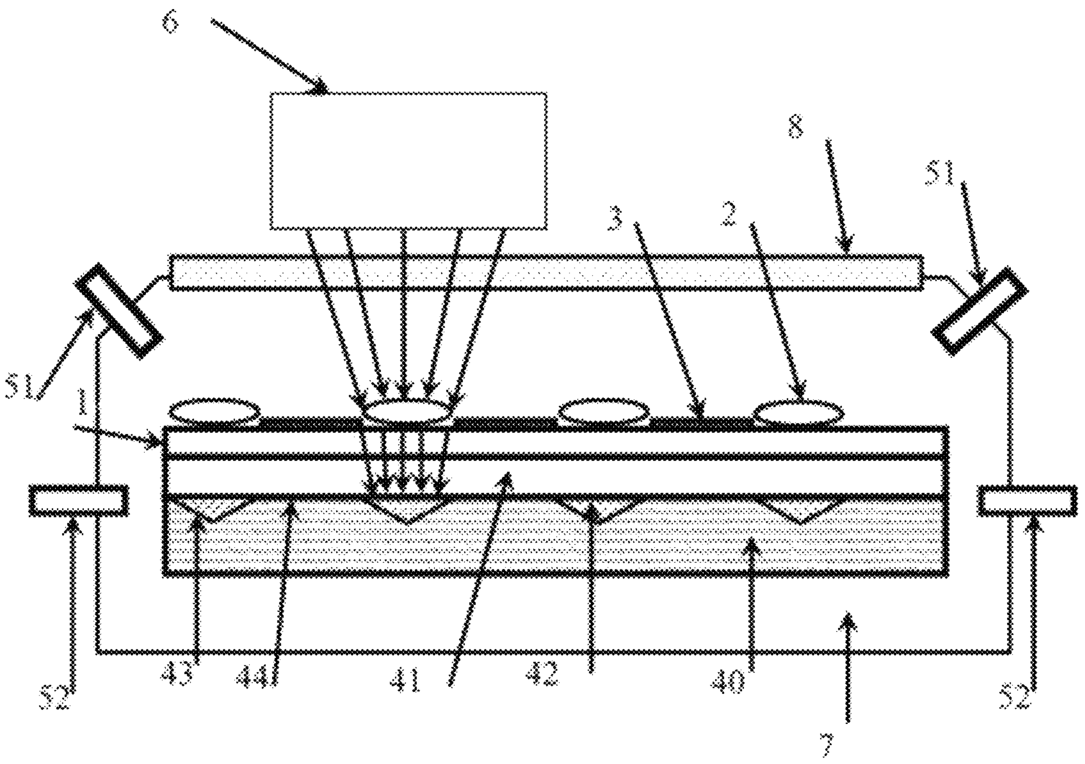
FIG. 1 is a drawing showing the first embodiment of the present disclosure.

Embodiment 1, the structural schematic diagram of the present disclosure is shown in FIG. 1.

First, the temperature control systems in the inlet pipe (51), exhaust pipe (52) and lift-off chamber (7) are adjusted to make it suitable for laser lift-off conditions.

When the laser light emitted by the ultraviolet source (6) enters the lift-off chamber (7), the laser light is shaped by the reshaping structure (2), and passes through the reshaping structure (2) and a local transmittance adjusting film (3) (one kind of the transmittance adjustment structure) at the periphery, to form a non-uniform light spot with an adjustable light intensity from the center to the edge. And the light spot passes through the substrate (1) (sapphire substrate) to reach at the interface between the interface between the sapphire substrate (41) and the epitaxial structure (40). The interface includes the oblique interface (43) of the patterned structure (42) and the epitaxial structure (40), the planar interface (44) between the sapphire substrate (41) and the epitaxial structure (40). Since the boundary conditions of the oblique interface (43) and the planar interface (44) are different, the required light energy density is also different, performing modulation on the light energy density by the above structure to form a light intensity transition area from the center area to the edge of the patterned structure (42), so that the sample can be lift off, which can also effectively reduce the generated stress.

The laser used for laser lift-off can be continuous light or pulse laser, and the wavelength of which is between 150 nm and 400 nm, and the spot size of ultraviolet source (6) should be between 100 nm and 1 mm. The size of the reshaping structure (2) shall be more than one fifth of the corresponding luminous wavelength. The size and period of the sapphire patterned structure should be more than one third of the luminous wavelength or more than 100 nm. The height of the sapphire patterned structure shall be more than 50 nm, which can be a periodic structure or an aperiodic structure, or specific adjustments can also be made as needed. The reshaping structure (2) can, be a convex lens, a concave lens or a Fresnel lens.

Figure 2:
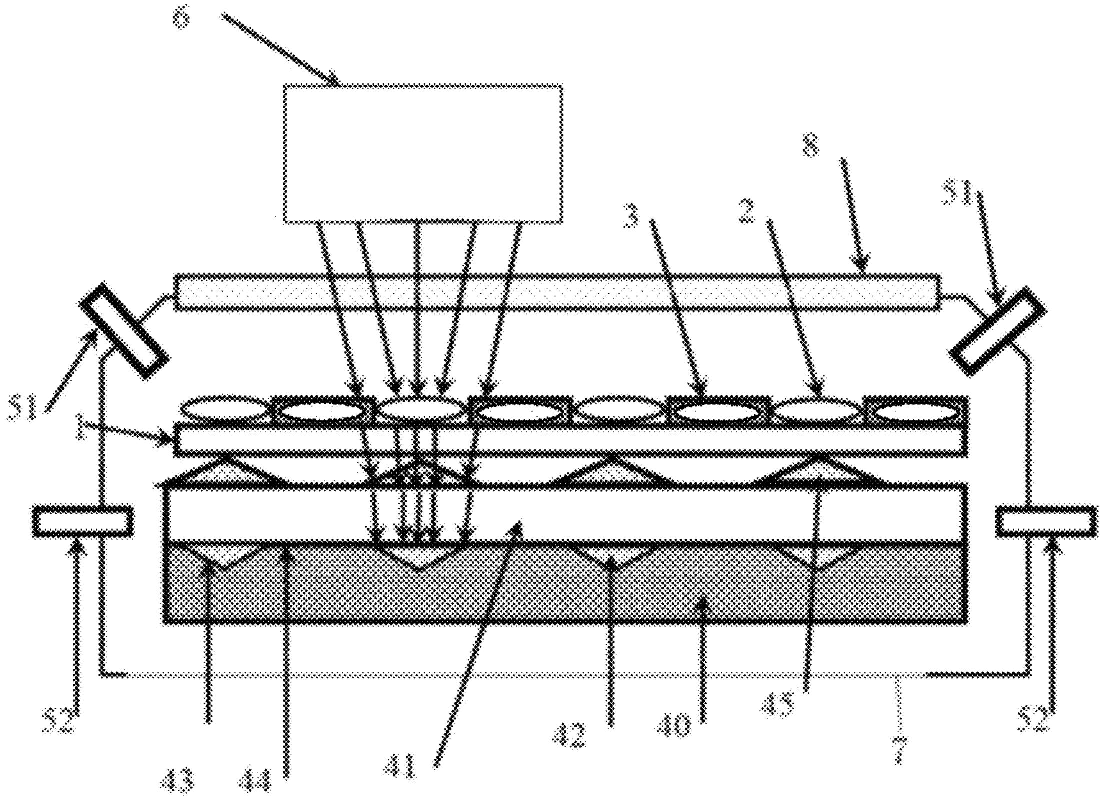
FIG. 2 is a drawing showing the second embodiment of the present disclosure.
Figure 3:
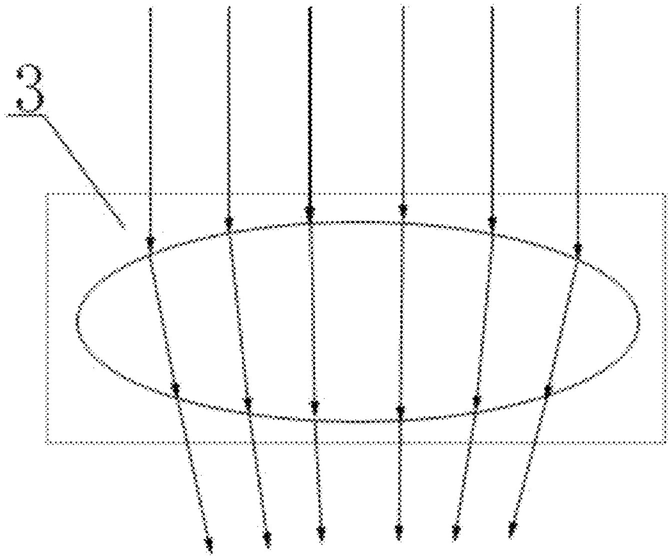
FIG. 3 is a schematic diagram of the transmittance adjustment structure of the present disclosure.

Embodiment 2, the structural diagram is shown in FIG. 2. The difference between this embodiment and Embodiment 1 is that the back surface of the sapphire substrate (41) is polished after the epitaxial structure (40) is grown on the front surface of the sapphire substrate (41), and a back surface patterned structure (45) is processed to form on the back surface, the shape of which can the same as or different from that of the front surface patterned structure (42), and the size of which can also the same as or different from that of the front surface patterned structure (42), the function of such structure is to modulate or compensate for light. For example, when the light spot reaches the upper surface of the sample through the substrate (1), if the back surface patterned structure (45) is a hemispherical lens structure, the light can be refocused, thereby forming a locally high energy density. In addition, the adjustment of light has also changed. In addition to the reshaping structure (2), the local transmittance adjustment film (3) adopts a hollow structure, so that the light is also shaped while adjusting, the transmittance. A hollow structure is designed in the middle of the transmittance adjusting structure (3), and the shape of the hollow structure is one of a circle, an ellipse, or a triangle.

In the present embodiment, a high-transmittance area corresponding to specific wavelengths such as 266 nm and 355 nm can be formed locally on the back of the sapphire substrate (40) by micro-sodium processing and coating technology, so that an area with high light transmittance and high light intensity is directly formed in the patterned (42) area, and only the wavelength of 355 nm passes in the rest area to make the spatial light intensity and wavelength adjustable.

What is claimed is:

1. A patterned epitaxial structure laser lift-off device, comprising a substrate (1), reshaping structures (2), a transmittance adjustment structure (3), a patterned epitaxial structure (4), gas transmission systems (5), an ultraviolet source (6), a lift-off chamber (7) and a light entry window (8), wherein the gas transmission systems are respectively provided at two sides of the lift-off chamber; the light entry window is arranged on the lift-off chamber; the ultraviolet source is above an outside of the light entry window; the patterned epitaxial structure is provided inside the lift-off chamber; the substrate is arranged on the patterned epitaxial structure; the patterned epitaxial structure comprises an epitaxial structure (40), a sapphire substrate (41), patterned structures (42), oblique interfaces (43) and planar interfaces (44), a plurality of patterned structures are uniformly provided on the epitaxial structure, each of the plurality of the patterned structures is a V-shaped groove structure formed by two oblique interfaces, and two adjacent patterned structures are connected by a planar interface, the sapphire substrate, is arranged on the epitaxial structure and the sapphire substrate is located above the patterned structures, the oblique interfaces and the planar interfaces; the substrate is located on the sapphire substrate, a plurality of reshaping structures are provided on the substrate; the reshaping structures are one-to-one correspondence to the patterned structures, the transmittance adjustment structure is provided between two adjacent reshaping structures and the transmittance adjustment structure is located on the substrate; the light entry window is located above the reshaping structures and the transmittance adjustment structure.

2. The patterned epitaxial structure laser lift-off device according to claim 1, wherein the gas transmission system (5) comprises an air inlet pipe (51) and an exhaust pipe (52), and the air inlet pipe (51) is respectively installed at upper corner positions of both sides of the lift-off chamber, and the exhaust pipe (52) is respectively installed at middle lower positions of the both sides of the lift-off chamber.

3. The patterned epitaxial structure laser lift-off device according to claim 1, the substrate (1) comprises a ultraviolet source excited laser wavelength transparent material, including but not limited to wide bandgap materials of sapphire, quartz, or calcium fluoride.

4. The patterned epitaxial structure laser lift-off device according to claim 1, wherein the transmittance adjustment structure (3) is installed in contact with edges of the reshaping structures (2), and a transition light field is formed around the reshaping structures (2); the transmittance adjustment structure (3) is arbitrary structures of high reflection medium film or multilayer film; the transmittance adjustment structure regulates reflectivity according to the needed, including but not limited to sapphire, calcium fluoride materials.

5. The patterned epitaxial structure laser lift-off device according to claim 1, wherein the patterned structure (42) is composed of a metal organic chemical vapor deposition (MOCVD) LED structure or a molecular beam epitaxy LD material structure; the substrate comprises the sapphire substrate (41), which is patterned substrate (PSS); and a material of the epitaxial structure (40) is single crystal material or multi-layer composite epitaxial material, wherein a thickness of the epitaxial structure is at least 1 micron.

6. The patterned epitaxial structure laser lift-off device according to claim 1, wherein the ultraviolet source (6) comprises an excimer laser, an all solid state laser, a pulse laser or a continuous laser; the ultraviolet source (6) is single wavelength or multi-wavelength; a spot size of the ultraviolet source (6) is between 100 nm and 1 mm.

7. The patterned epitaxial structure laser lift-off device according to claim 1, wherein the reshaping structure (2) is a convex lens, a concave lens or a Fresnel lens structure, and a dimension of the reshaping structure (2) is more than one-fifth of the corresponding light-emitting wavelength.

8. The patterned epitaxial structure laser lift-off device according to claim 1, wherein the patterned structure is the sapphire patterned structure, and a size and a period of the patterned structure is more than one third of the light-emitting wavelength or more than 100 nm.

* * * * *